(12) United States Patent
Zhang et al.

(10) Patent No.: US 10,492,278 B2
(45) Date of Patent: Nov. 26, 2019

(54) BLUETOOTH CONTROLLER

(71) Applicant: SHENZHEN JBT SMART LIGHTING CO., LTD., Shenzhen, Guangdong (CN)

(72) Inventors: Wenbin Zhang, Guangdong (CN); Huiping Chen, Guangdong (CN); Guangli Guo, Guangdong (CN); Xin Huang, Guangdong (CN); Zhiguang Peng, Guangdong (CN)

(73) Assignee: SHENZHEN JBT SMART LIGHTING CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/768,444

(22) PCT Filed: May 19, 2017

(86) PCT No.: PCT/CN2017/085124
§ 371 (c)(1),
(2) Date: Apr. 13, 2018

(87) PCT Pub. No.: WO2017/206738
PCT Pub. Date: Dec. 7, 2017

(65) Prior Publication Data
US 2018/0338371 A1    Nov. 22, 2018

(30) Foreign Application Priority Data
Jun. 3, 2016   (CN) .................... 2016 2 0538605 U

(51) Int. Cl.
*H05B 33/08* (2006.01)
*H05B 37/02* (2006.01)
(Continued)

(52) U.S. Cl.
CPC .......... *H05B 37/0272* (2013.01); *H02M 3/10* (2013.01); *H04W 4/80* (2018.02);
(Continued)

(58) Field of Classification Search
CPC ........ H05B 33/08; H05B 37/02; H05B 10/50; H05B 10/116; A61H 23/02; G05B 15/02
(Continued)

(56) References Cited

U.S. PATENT DOCUMENTS 9,060,409 B2 *   6/2015   Bowers .............. H05B 33/0863
9,810,414 B2 *  11/2017   Kim ...................... F21V 23/009
(Continued)

FOREIGN PATENT DOCUMENTS

CN    204345559 U    5/2015
CN    204592983      8/2015
(Continued)

OTHER PUBLICATIONS

International Search Report issued for International Patent Application No. PCT/CN2017/085124, dated Aug. 22, 2017, 7 pages including English translation.
(Continued)

*Primary Examiner* — Xiaoliang Chen
(74) *Attorney, Agent, or Firm* — Hamre, Schumann, Mueller & Larson, P.C.

(57) ABSTRACT

A Bluetooth controller (100) comprises: a controller housing assembly (1); a control module (2), disposed in the controller housing assembly (1); a Bluetooth mesh module (3), used for receiving an external control signal by means of Bluetooth and coupled to the control module (2); a Bluetooth control circuit (5), used for controlling the light emitting unit and coupled to the control module (2); and a Bluetooth power supply module (4), used for supplying a direct current to the Bluetooth control circuit (5) and coupled to the
(Continued)

Bluetooth control circuit (5). By means of a Bluetooth wireless control technology, remote brightness adjustment, color adjustment, timing, splendid colors with music, profiles and other functions are implemented by the controller, thereby bringing convenience to the life of the people, and increasing the variety and the enjoyment of smart home lighting.

5 Claims, 4 Drawing Sheets

(51) Int. Cl.
*A61H 23/02* (2006.01)
*G05B 15/02* (2006.01)
*H04W 4/80* (2018.01)
*H02M 3/10* (2006.01)
*H05K 1/18* (2006.01)
*H05K 7/14* (2006.01)

(52) U.S. Cl.
CPC ......... *H05B 33/0857* (2013.01); *H05B 37/02* (2013.01); *H05K 1/181* (2013.01); *H05K 7/1427* (2013.01); *H05K 2201/10015* (2013.01); *H05K 2201/10053* (2013.01); *H05K 2201/10098* (2013.01); *H05K 2201/10121* (2013.01); *H05K 2201/10174* (2013.01); *H05K 2201/10325* (2013.01); *Y02B 20/42* (2013.01); *Y02B 20/48* (2013.01)

(58) Field of Classification Search
USPC ......... 361/752; 315/292; 398/118; 455/41.2; 601/49; 700/275; 1/1
See application file for complete search history.

(56) References Cited

U.S. PATENT DOCUMENTS

| | | | | |
|---|---|---|---|---|
| 2013/0063042 | A1* | 3/2013 | Bora | H05B 33/0863 315/292 |
| 2013/0289770 | A1* | 10/2013 | Rawls-Meehan | G05B 15/02 700/275 |
| 2014/0239816 | A1 | 8/2014 | Lee et al. | |
| 2015/0147067 | A1* | 5/2015 | Ryan | H04B 10/116 398/118 |
| 2015/0257091 | A1* | 9/2015 | Zur | H04L 67/303 455/41.2 |
| 2016/0120740 | A1* | 5/2016 | Rawls-Meehan | A61H 23/0263 601/49 |
| 2016/0191642 | A1* | 6/2016 | Acar | H04L 67/2814 455/41.2 |
| 2016/0248506 | A1* | 8/2016 | Ryan | H04B 10/116 |
| 2016/0277202 | A1* | 9/2016 | Davis | H04L 67/125 |
| 2016/0323012 | A1* | 11/2016 | Kwon | H04B 1/7143 |
| 2016/0323962 | A1* | 11/2016 | Weaver | H05B 33/0869 |
| 2017/0061037 | A1* | 3/2017 | Makem | G06T 17/10 |
| 2017/0231058 | A1* | 8/2017 | Sadwick | H05B 33/0857 |
| 2017/0257918 | A1* | 9/2017 | Ansart | H05B 33/0845 |
| 2018/0247004 | A1* | 8/2018 | Allen | G06T 19/00 |

FOREIGN PATENT DOCUMENTS

| | | |
|---|---|---|
| CN | 204611558 U | 9/2015 |
| CN | 204994012 U | 1/2016 |
| CN | 205793520 U | 12/2016 |
| EP | 3367753 | 8/2018 |
| WO | 2015/049412 | 4/2015 |
| WO | 2017/206638 | 12/2017 |
| WO | 2017/206639 | 12/2017 |
| WO | 2017/206640 | 12/2017 |
| WO | 2017/206641 | 12/2017 |
| WO | 2017/206737 | 12/2017 |

OTHER PUBLICATIONS

Extended European Search Report, issued in the corresponding European patent application No. dated Dec. 4, 2018, 11 pages.

* cited by examiner

BLUETOOTH CONTROLLER

TECHNICAL FIELD

The present application relates to the technical field of bluetooth control technology, and more particularly, to a bluetooth controller.

BACKGROUND ART

With the popularity of LED technology, more and more LED lights are used in people's life. Currently on the market, almost all wireless dimming and color temperature adjusting remote controllers employ radio frequency control technology, which has a weak anti-interference ability, networking inconvenience, mediocre reliability, and cannot achieve scenario modes, music-controlling colors, and other functions. Moreover, in conventional art, there is a technical bottleneck in integrating the lighting function of the light and the Bluetooth communication function.

SUMMARY

An object of the present application is to provide a bluetooth controller to solve the difficulty of realizing a remote diversification operation of the lights and the technical bottleneck in integrating the lighting function of the light and the Bluetooth communication function in conventional art.

The technical solution of the present application is implemented as follows:

The present application provides a bluetooth controller, comprising:

a controller housing assembly;

a control module disposed inside the controller housing assembly;

a bluetooth mesh module configured for receiving external control signal through bluetooth, the bluetooth mesh module is coupled to the control module;

a bluetooth control circuit configured for controlling a light-emitting unit, the bluetooth control circuit is coupled to the control module;

a bluetooth power supply module configured for providing direct-current to the bluetooth control circuit, the bluetooth power supply module is coupled to the bluetooth control circuit.

In the bluetooth controller of the present application, the controller housing assembly comprises a controller end housing, a circuit board, and a controller mask, wherein, the controller end housing is fixedly connected to the controller mask to form a cavity, and the circuit board is disposed inside the cavity, the circuit board is fixedly connected to the inside surface of the controller end housing;

the control module, the bluetooth mesh module, the bluetooth control circuit, and the bluetooth power supply module are all disposed on the circuit board.

In the bluetooth controller of the present application, the bluetooth control circuit comprises a bluetooth module socket, and a plurality of terminals of the bluetooth module socket are respectively coupled to a plurality of pins of the control module;

a plurality of MOS tubes respectively coupled to the plurality of terminals of the bluetooth module socket;

a light strip cable socket configured for connecting the light-emitting unit, and a plurality of terminals of the light strip cable socket are respectively coupled to the plurality of MOS tubes.

The bluetooth controller of the present application further comprises:

a radio frequency module, wherein the radio frequency module is coupled to the control module.

In the bluetooth controller of the present application, the radio frequency module comprises:

a radio frequency circuit coupled to the control module;

a radio frequency antenna coupled to the radio frequency circuit.

In the bluetooth controller of the present application, the bluetooth power supply module comprises:

a buck circuit for reducing voltage of a input direct-current;

a voltage-stabilizing circuit coupled to the buck circuit;

a direct-current output unit coupled to the voltage-stabilizing circuit, the buck circuit and the light strip cable socket.

In the bluetooth controller of the present application, the voltage-stabilizing circuit comprises:

a storage capacitor coupled to the buck circuit;

a zener diode coupled to the storage capacitor and the buck circuit.

In the bluetooth controller of the present application, each drain of the MOS tubes is coupled to the light strip cable socket, and each grid of the MOS tubes is coupled to the bluetooth module socket.

Therefore, the beneficial effects of the present application is achieving functions such as the remote adjusting of brightness, remote adjusting of color, timing, colors changing along with music and setting profiles through bluetooth wireless control technology to facilitate people's life and increase the diversity and delight of intelligent home lighting.

BRIEF DESCRIPTION OF THE DRAWINGS

The present application will be further described with reference to the accompanying drawings and embodiments, and in the accompanying drawings.

DETAILED DESCRIPTION

For a clearer understanding of the technical features, objectives and effects of the present application, the specific embodiments of the present application will be described in detail below with reference to the accompanying drawings. It should be understood that the following descriptions are merely specific descriptions of the embodiments of the present application, and should not be used to limit the protection scope of the present application.

The present application provides a bluetooth controller 100 to achieve functions of networking freely through using bluetooth mesh control technology in LED controller, and achieve the ability of remote control functions such as adjusting the brightness, the color and colors changing along with the music through a terminal intelligent remote controller or remoter, which meets different people's need, and is of high operability and good experience.

Figure 1:
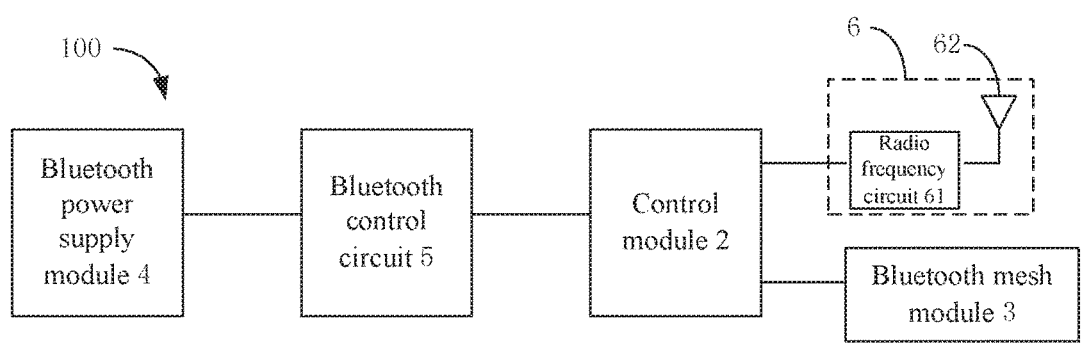
FIG. 1 is a module block diagram of a bluetooth controller provided by the present application.

Referring to FIG. 1, which is a module block diagram of a bluetooth controller 100 provided by the present application, the bluetooth controller 100 comprises a controller housing assembly 1, a control module 2, a bluetooth mesh module 3, a bluetooth power supply module 4, and a bluetooth control circuit 5.

The control module 2 is disposed inside the controller housing assembly 1;

the bluetooth mesh module 3 configured for receiving external signal by bluetooth is coupled to the control module 2;

the bluetooth control circuit 5 configured for controlling a light-emitting unit is coupled to the control module 2;

the bluetooth power supply module 4 configured for providing direct-current to the bluetooth control circuit is coupled to the bluetooth control circuit 5.

Figure 2:
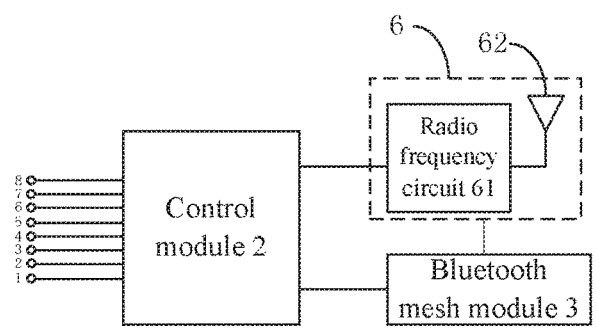
FIG. 2 is a schematic diagram of connecting of a control module provided by the present application.

Referring to FIG. 2, which is a schematic connecting diagram of the control module 2 provided by the present application, the control module 2 includes eight output pins, and is connected to a radio frequency module 6 and the bluetooth mesh module 3. The control module 2 is preferably internally installed with a 16 KB data memory (SRAM), and is embedded with a 32-bit high-performance MCU and a maximum 48 MHZ clock signal. Powerful storage capabilities are able to provide sufficient capacity to input control programs and to achieve rich and varied control functions.

As shown in FIG. 2, the bluetooth controller 100 further includes a radio frequency module 6. The radio frequency module 6 includes a radio frequency circuit 61 and a radio frequency antenna 62. The radio frequency circuit 61 is coupled to the control module 2; the radio frequency antenna 62 is coupled to the radio frequency circuit 61.

Figure 3:
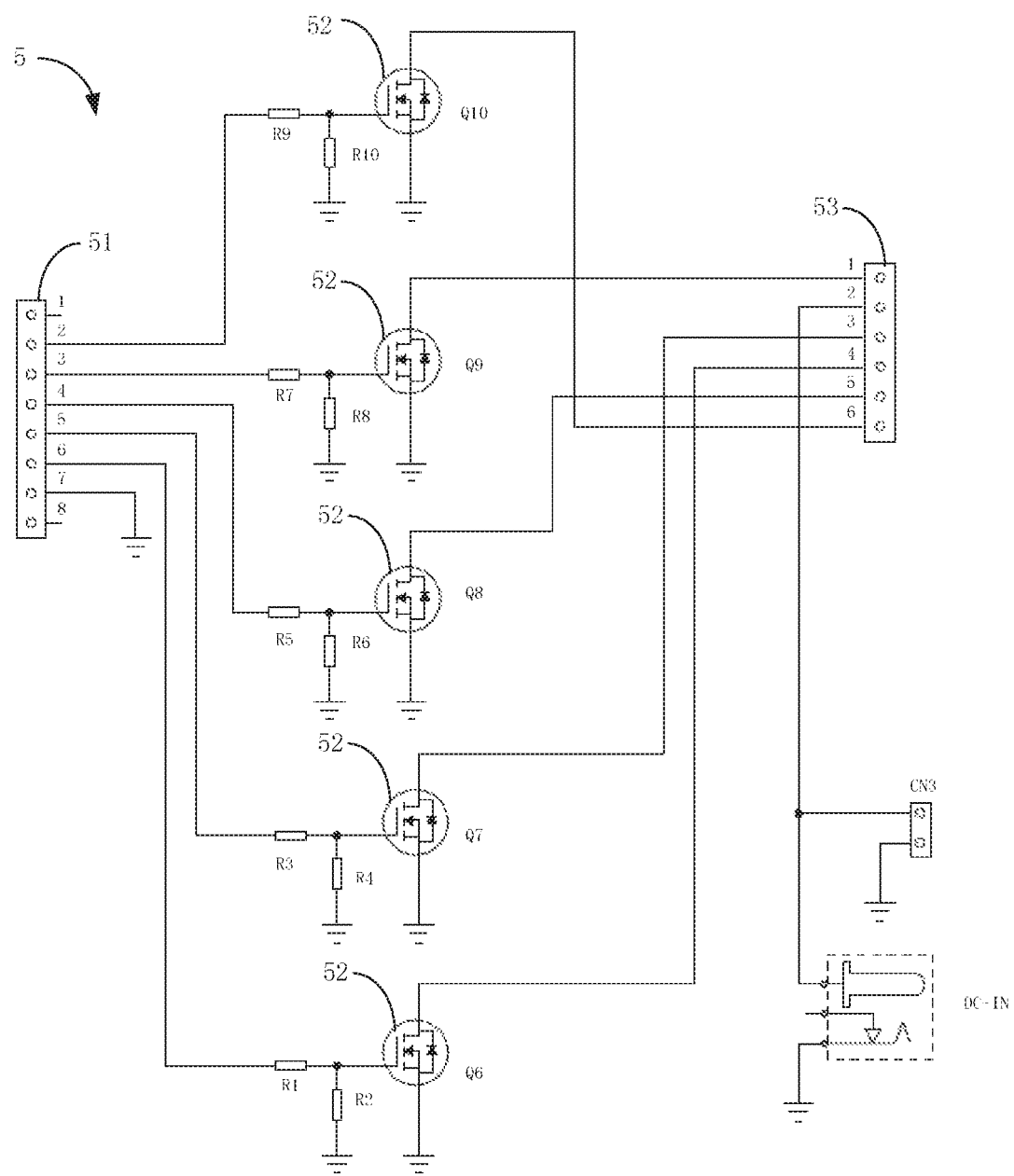
FIG. 3 is a schematic structural view of a bluetooth control circuit provided by the present application.

Referring to FIG. 3, which is a schematic structural view of the bluetooth control circuit 5 provided by the present application, the bluetooth control circuit 5 includes a bluetooth module socket 51, a plurality of MOS tubes 52, and a light strip cable socket 53.

The plurality of terminals of the bluetooth module socket 51 are respectively coupled to a plurality of pins of the control module 2. As shown in FIG. 3, in an embodiment of the present application, the bluetooth module socket 51 includes eight terminals (1-8) respectively connected to eight output pins of the control module 2.

The plurality of MOS tubes 52 are respectively coupled to the plurality of terminals of the bluetooth module socket 51. As shown in FIG. 3, in one embodiment of the present application, there are five MOS tubes (Q6-Q10).

The light strip cable socket 53 is configured for connecting the light-emitting unit. A plurality of terminals of the light strip cable socket 53 are respectively coupled to the plurality of MOS tubes.

As shown in FIG. 3, the light strip cable socket has 6 terminals (1-6), wherein the terminals 1, and 3 to 6 are respectively connected to five MOS tubes (Q6-Q10), and the terminals are also connected to a red LED, a blue LED, a green LED, a cool white LED, and a warm white LED loaded in the LED bulb. A terminal 2 is connected to the bluetooth power supply module to access operating voltage.

The circuit function of the bluetooth control circuit 5 is that, an internal MCU (i.e., the control module 2) receives the instruction of the intelligent terminal device after the bluetooth control circuit 5 is on; and the control module 2 outputs five PWM brightness adjusting, color adjusting, and RGB signals to control on and off time periods of the five MOSs Q6, Q7, Q8, Q9, Q10. Each drain of the MOS tubes is coupled to the light strip cable socket, and each grid of the MOS tubes is coupled to the bluetooth module socket. The control module 2 controls the working state of each LED strip by receiving instructions from an intelligent terminal device so as to control changes of output color temperature, brightness, and colors of the LED to realize an adjustment of brightness and color.

Figure 4:
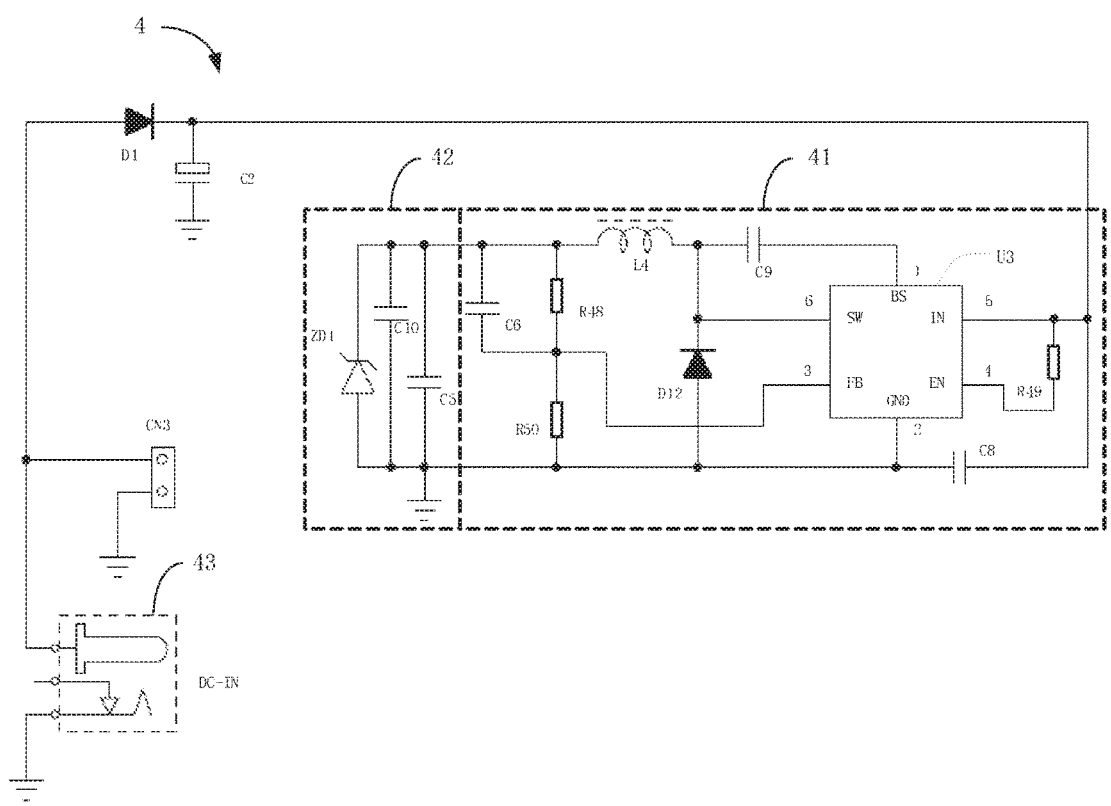
FIG. 4 is a schematic structural view of a bluetooth power supply module provided by the present application.

Referring to FIG. 4 which is a schematic structural view of a bluetooth power supply module 4 provided by the present application, the bluetooth power supply module 4 comprises a buck circuit 41, a voltage-stabilizing circuit 42, and a direct-current output unit 43.

The buck circuit 41 is used to reduce voltage of an input direct-current.

The voltage-stabilizing circuit 42 is coupled to the buck circuit 41. The voltage-stabilizing circuit 42 comprises a storage capacitor C5 and a zener diode ZD1. The storage capacitor C5 is coupled to the buck circuit 41, and the zener diode 41 is coupled to the storage capacitor C5 and the buck circuit 41. The direct-current output unit 43 is coupled to the voltage-stabilizing circuit 42, the buck circuit 41, and the light strip cable socket 53.

A type of U3 in the buck circuit 41 is SI3116. A function of the buck circuit 41 is to reduce a 12-24V direct-current voltage to constant 3.3V voltage. In addition, there is a 3.3V zener diode ZD1 to more accurately supply power to the bluetooth module. A general work process of the circuit is as follow: when pin 5 on U3 is electrified, the U3 starts to work, and a divider resistor externally connected to pin 3 and pin FB is used to adjust duty cycle, which is to regulate output voltage to 3.3V. D12 in a peripheral circuit of U3 is a free-wheeling diode, and a electrolytic capacitor C5 is configured for providing energy.

Figure 5:
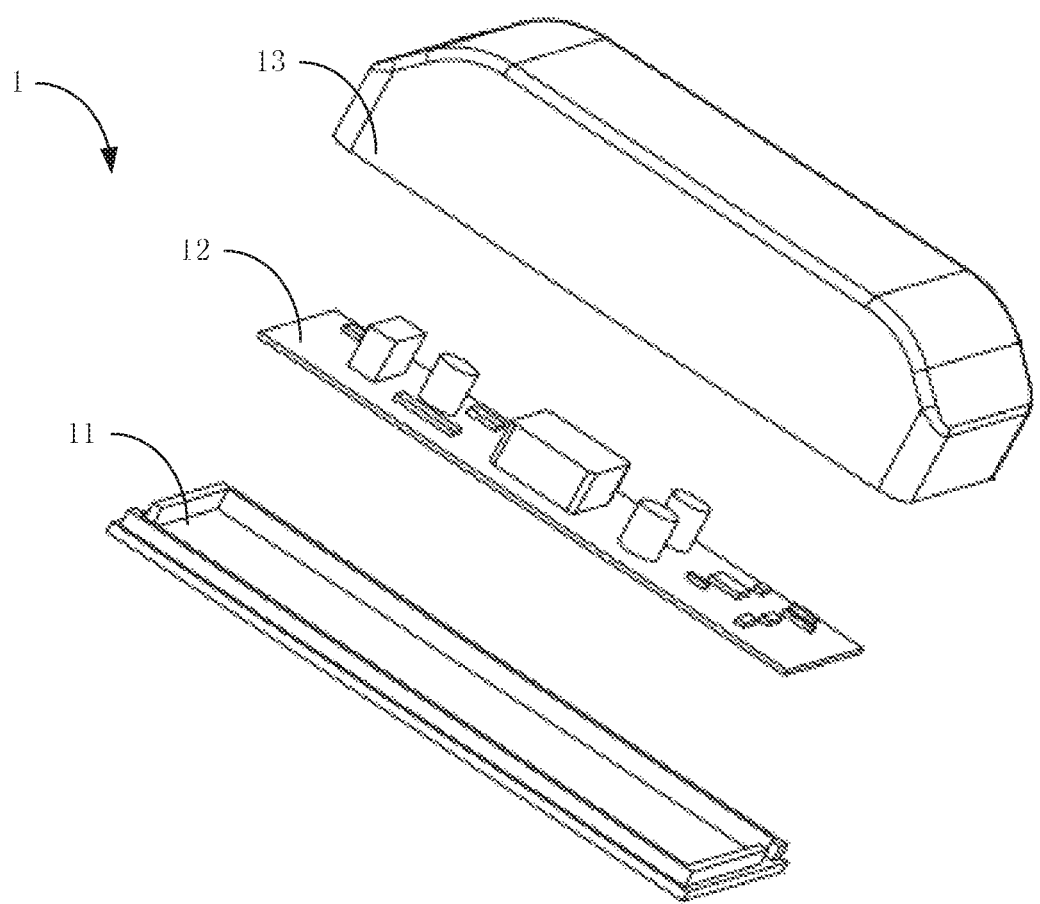
FIG. 5 is a schematic structural view of a controller housing assembly provided by the present application.

Referring to FIG. 5 which is a schematic structural view of a controller housing assembly 1 provided by the present application, the controller housing assembly 1 comprises controller end housing 11, a circuit board 12, and a controller mask 14, wherein, the controller end housing 11 is fixedly connected to the controller mask 13 to from a cavity, and the circuit board 12 is disposed inside the cavity, the circuit board is fixedly connected to the inside surface of the controller end housing;

the control module 2, the bluetooth mesh module 3, the bluetooth control circuit 5 and the bluetooth power supply module 4 are all disposed on the circuit board 12.

Various operations of the embodiments are provided herein. In one embodiment, one or the described operations may constitute one or computer-readable instructions stored in a computer-readable medium that, when executed by an electronic device, will cause the computing device to perform the described operations. The order in which some or all of the operations are described should not be construed as to imply that the operations must be order dependent. Those skilled in the art will understand an alternative ordering that has the benefit of this description. Moreover, it should be understood that not all operations need to be present in every embodiment provided herein.

Moreover, the term "preferred" as used herein is intended to serve as an example, embodiment, or illustration. Any aspect or design described as "preferred" need not be construed as advantageous over other aspects or designs. In contrast, the use of the term "preferred" is intended to provide concepts in a concrete manner. The term "or" as used in this application is intended to mean an inclusive "or" rather than an exclusive "or." That is, unless specified otherwise or clear from the context, "X employs A or B" means naturally include any one of the permutations. That is, "X using A or B" is satisfied in any of the foregoing examples if X uses A; X uses B; or X uses both A and B.

Moreover, while the disclosure has been shown and described with respect to one or more implementations, those skilled in the art will readily recognize that modifications and adaptations are based on a reading and understanding of the specification and drawings. The disclosure includes all such modifications and variations, and is limited only by the scope of the claims. In particular regard to the various functions performed by the above described components (e.g., elements, resources, etc.), the terms used to describe such components are intended to correspond with the specified functions (e.g., that are functionally equivalent) that perform the components. Any of the components, unless otherwise indicated, are structurally identical to the disclosed structure that performs the functions in the exemplary implementations of the present application shown herein. In addition, while a particular feature of the disclosure may have been disclosed with respect to only one of several implementations, such feature may be other than one or other features of other implementations as may be desirable and advantageous for a given or particular application combination. Also, to the extent that the terms "include", "have", "comprise" or variations thereof are used in either the detailed description or the claims, such terms are intended to be inclusive in a similar manner to the term "comprising."

In summary, although the present application has been disclosed by the preferred embodiments, the above preferred embodiments are not intended to limit the present application. Those skilled in the art may make various modifications without departing from the spirit and scope of the present application. Therefore, the protection scope of the present application is subject to the scope defined by the claims.

The invention claimed is:

1. A bluetooth controller, comprising:
   a controller housing assembly;
   a control module disposed inside the controller housing assembly;
   a bluetooth mesh module configured for receiving external control signal through bluetooth, coupled to the control module;
   a bluetooth control circuit configured for controlling a light-emitting unit, coupled to the control module; and
   a bluetooth power supply module configured for providing direct-current to the bluetooth control circuit, coupled to the bluetooth control circuit,
   wherein the controller housing assembly comprises a controller end housing, a circuit board, and a controller mask;
   the controller end housing is fixedly connected to the controller mask to form a cavity, and the circuit board is disposed inside the cavity; and
   the control module, the bluetooth mesh module, the bluetooth control circuit and the bluetooth power supply module are all disposed on the circuit board.

2. A bluetooth controller, comprising:
   a controller housing assembly;
   a control module disposed inside the controller housing assembly;
   a bluetooth mesh module configured for receiving external control signal through bluetooth, coupled to the control module;
   a bluetooth control circuit configured for controlling a light-emitting unit, coupled to the control module; and
   a bluetooth power supply module configured for providing direct-current to the bluetooth control circuit, coupled to the bluetooth control circuit
   wherein the bluetooth control circuit comprises:
   a bluetooth module socket, and a plurality of terminals of the bluetooth module socket are respectively coupled to a plurality of pins of the control module;
   a plurality of MOS tubes respectively coupled to the plurality of terminals of the bluetooth module socket; and
   a light strip cable socket configured for connecting the light-emitting unit, and a plurality of terminals of the light strip cable socket are respectively coupled to the plurality of MOS tubes.

3. The bluetooth controller of claim 2, wherein the bluetooth power supply module comprises:
   a buck circuit for reducing voltage of a input direct-current;
   a voltage-stabilizing circuit coupled to the buck circuit;
   a direct-current output unit coupled to the voltage-stabilizing circuit, the buck circuit and the light strip cable socket.

4. The bluetooth controller of claim 3, wherein the voltage-stabilizing circuit comprises:
   a storage capacitor coupled to the buck circuit,
   a zener diode coupled to the storage capacitor and the buck circuit.

5. The bluetooth controller of claim 2, wherein each drain of the MOS tubes is coupled to the light strip cable socket, and each grid of the MOS tubes is coupled to the bluetooth module socket.

* * * * *